(12) United States Patent
Dornbusch

(10) Patent No.: US 7,042,272 B2
(45) Date of Patent: May 9, 2006

(54) TRANSCONDUCTANCE AMPLIFIER WITH SUBSTANTIALLY CONSTANT RESISTANCE AND MIXER USING SAME

(75) Inventor: Andrew W. Dornbusch, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 9 days.

(21) Appl. No.: 10/853,633

(22) Filed: May 25, 2004

(65) Prior Publication Data

US 2005/0264339 A1    Dec. 1, 2005

(51) Int. Cl.
*G06F 7/44* (2006.01)
(52) U.S. Cl. .................. 327/356; 327/359; 455/323; 455/333
(58) Field of Classification Search ........ 327/355–361; 455/326, 333, 323
See application file for complete search history.

(56) References Cited

U.S. PATENT DOCUMENTS

| | | | |
|---|---|---|---|
| 5,221,926 A | | 6/1993 | Jackson |
| 5,999,804 A | * | 12/1999 | Forgues ...................... 455/333 |
| 6,035,186 A | | 3/2000 | Moore et al. |
| 6,104,227 A | * | 8/2000 | Durec et al. ................ 327/359 |
| 6,122,497 A | * | 9/2000 | Gilbert ....................... 455/333 |
| 6,529,100 B1 | | 3/2003 | Okanobu |
| 6,826,393 B1 | * | 11/2004 | Komurasaki et al. ....... 455/326 |

OTHER PUBLICATIONS

Wiegerink, Remco J., "Synthesis of MOS translinear circuits," The Kluwer International Series in Engineering and COmputer Science, vol. 246, pp. 78-85, Aug. 1993.
"SAW Components," EPCOS AG Data Sheet Y 7103 L, Surface Acoustic Wave Components Division OFW E UE, 6 pp, Jun. 14, 2000.

(Continued)

*Primary Examiner*—Dinh T. Le
(74) *Attorney, Agent, or Firm*—Toler, Larson & Abel, LLP

(57) ABSTRACT

A transconductance amplifier (620) includes four transistors each operating in saturation and strong inversion. A first transistor (622) has a first current electrode and a control electrode both receiving an input voltage, and a second current electrode coupled to a power supply voltage terminal. A second transistor (624) has a first current electrode, a control electrode coupled to the first current electrode of the first transistor (622), and a second current electrode coupled to the power supply voltage terminal. A third transistor (626) has a first current electrode for providing a negative differential current, a control electrode for receiving a bias voltage, and a second current electrode coupled to the first current electrode of the first transistor (622). A fourth transistor (628) has a first current electrode for providing a positive differential current, a control electrode for receiving the bias voltage, and a second current electrode coupled to the first current electrode of the second transistor (624).

22 Claims, 7 Drawing Sheets

OTHER PUBLICATIONS

Terrovitis, M. T. and Meyer, R. G., "Noise and Intermodulation Distortion in Current-Commutating CMOS Mixers," Berkeley Wireless Research Center Retreat, 3 pp, Jun. 1999.

Karvonen, S. et al., "A Low Noise Quadrature Subsampling Mixer," Proceedings of IEEE International Symposium of Circuits and Systems (ISCAS2001), Darling Harbour, Sydney, Australia, IV-790—IV-793, Sep. 2001.

Lee, Kyeongho, et al, "A Single-Chip 2.4-GHz Direct-Conversion CMOS Receiver for Wireless Local Loop using Multiphase Reduced Frequency Conversion Technique," IEEE Journal of Solid-State Circuits, vol. 36, No. 5, pp. 800-809, May 2001.

Hornak, Thomas et al., "An Image-Rejecting Mixer and Vector Filter with 55-dB Image Rejection over Process, Temperature, and Transistor Mismatch," IEEE Journal of Solid-State Circuits, vol. 36, No. 1, pp. 23-33, Jan. 2001.

Hornak, Tom, "Using polyphase filters as image attenuators," RF Signal Processing, [online] www.rfdesign.com, pp. 26-34, Jun. 2001.

* cited by examiner

*FIG. 3 -PRIOR ART-*

TRANSCONDUCTANCE AMPLIFIER WITH SUBSTANTIALLY CONSTANT RESISTANCE AND MIXER USING SAME

CROSS REFERENCE TO RELATED APPLICATIONS

Related subject matter is contained in the following copending applications:
1. Application No. 10/814,615, filed on Mar. 31, 2004, entitled "Polyphase Filter with Passband Compensation and Method Therefor" invented by Andrew W. Dornbusch and assigned to the assignee hereof.
2. Application No. unknown, filed of even date herewith, entitled "Mixer with Clock Resynchronization and Method Therefor" invented by Andrew W. Dornbusch and assigned to the assignee hereof.
3. Application No. unknown, filed of even date herewith, entitled "Low Distortion Quadrature Mixer and Method Therefor" invented by Andrew W. Dornbusch and assigned to the assignee hereof.

TECHNICAL FIELD

The present invention generally relates to frequency conversion circuits, and more particularly to mixers.

BACKGROUND

Radio frequency (RF) devices transmit an information signal from one point to another by moving the information signal to a higher frequency range that is more suitable for transmission over the medium being used. This process is known as upconversion. As used herein, "radio frequency signal" means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. An RF transmitter mixes the desired signal, known as the baseband signal, with an RF carrier frequency for transmission over the selected medium. An RF receiver then mixes the signal with the carrier frequency to restore the signal to its original frequency.

A superheterodyne receiver is a receiver that mixes the desired data-carrying signal with the output of local oscillator to produce an output at a fixed intermediate frequency (IF). The fixed IF signal can then be conveniently filtered and converted back down to baseband for further processing. Superheterodyne receivers are useful in a wide variety of applications in which the desired channel can occur within a wide band of frequencies, such as AM and FM radio, satellite radio, etc.

To reduce the cost of a superheterodyne radio receiver, it is useful to combine as many circuit elements as possible into a single integrated circuit (IC). While contemporary complementary metal-oxide-semiconductor (CMOS) technology can operate fast enough to process RF and IF signals, certain other functions cannot be easily integrated into CMOS processes. For example, inductors and capacitors may be fabricated on low-cost CMOS ICs to form LC filters, but LC filters do not provide a very good frequency response to filter the selected IF. Another known type of filter that provides better channel selectivity than an LC filter is known as a surface acoustic wave (SAW) filter. A SAW filter is a piezoelectric device that converts an electrical signal to a mechanical vibration signal and then back to an electrical signal. Filtering is achieved through the interaction of signal transducers in the conversion process.

However a filter of this type is typically constructed using zinc oxide ($ZnO_2$), a material that is as yet incompatible with integration on a CMOS circuit utilizing a silicon substrate. Thus a low-cost CMOS receiver may benefit from the use of an external SAW filter and have input terminals connected to the output terminals of the SAW filter. Existing SAW filters can be modeled as voltage sources having a characteristic source impedance, for example a source resistance in parallel with a source capacitance. In order for the filter to operate with the desired bandpass properties, it is necessary to terminate the source resistance of the SAW filter with a matching resistance before the signal can be mixed from IF to baseband. However resistors integrated into CMOS processes are characteristically noisy. Thus better circuits for terminating signals from, for example, external SAW filters would be desirable.

BRIEF SUMMARY

In one form a transconductance amplifier includes a first transistor, a second transistor, a third transistor, and a fourth transistor. The first transistor has a first current electrode for receiving an input voltage, a control electrode coupled to the first current electrode, and a second current electrode coupled to a power supply voltage terminal. The second transistor has a first current electrode, a control electrode coupled to the first current electrode of the first transistor, and a second current electrode coupled to the power supply voltage terminal. The third transistor has a first current electrode for providing a negative current of a differential current pair, a control electrode for receiving a bias voltage, and a second current electrode coupled to the first current electrode of the first transistor. The fourth transistor has a first current electrode for providing a positive current of the differential current pair, a control electrode for receiving the bias voltage, and a second current electrode coupled to the first current electrode of the second transistor. The first, second, third, and fourth transistors are characterized as operating in saturation and strong inversion.

In another form a transconductance amplifier includes first through eighth transistors. The first transistor has a first current electrode for receiving a positive voltage of a differential input voltage pair, a control electrode coupled to the first current electrode, and a second current electrode coupled to a first power supply voltage terminal. The second transistor has a first current electrode, a control electrode coupled to the first current electrode of the first transistor, and a second current electrode coupled to the first power supply voltage terminal. The third transistor has a first current electrode for providing a negative current of a first differential current pair, a control electrode for receiving a bias voltage, and a second current electrode coupled to the first current electrode of the first transistor. The fourth transistor has a first current electrode for providing a negative current of the first differential current pair, a control electrode for receiving the bias voltage, and a second current electrode coupled to the first current electrode of the second transistor. The fifth transistor has a first current electrode for receiving a negative voltage of the differential input voltage pair, a control electrode coupled to the first current electrode, and a second current electrode coupled to the power supply voltage terminal. The sixth transistor has a first current electrode, a control electrode coupled to the first current electrode of the fifth transistor, and a second current electrode coupled to the power supply voltage terminal. The seventh transistor has a first current electrode for providing a positive current of a second differential current pair, a control electrode for receiving the bias voltage, and a second current electrode coupled to the first current electrode of the fifth transistor. The eighth transistor has a first current electrode for providing a negative current of the second differential current pair, a control electrode for receiving the bias voltage, and a second current electrode coupled to the first current electrode of the sixth transistor.

In yet another form a mixer includes a transconductance amplifier and a chopper circuit. The transconductance amplifier generates a first differential current pair in response to an input voltage. The chopper circuit receives the first differential current and a first mixing signal and has an output for providing positive and negative currents of a first differential current pair to first and second nodes, respectively, in response thereto. The transconductance amplifier includes first, second, third, and fourth transistors. The first transistor has a first current electrode for receiving an input voltage, a control electrode coupled to the first current electrode, and a second current electrode coupled to a power supply voltage terminal. The second transistor has a first current electrode, a control electrode coupled to the first current electrode of the first transistor, and a second current electrode coupled to the power supply voltage terminal. The third transistor has a first current electrode for providing the negative current of the differential current pair, a control electrode for receiving a bias voltage, and a second current electrode coupled to the first current electrode of the first transistor. The fourth transistor has a first current electrode for providing the positive current of the differential current pair, a control electrode for receiving the bias voltage, and a second current electrode coupled to the first current electrode of the second transistor.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
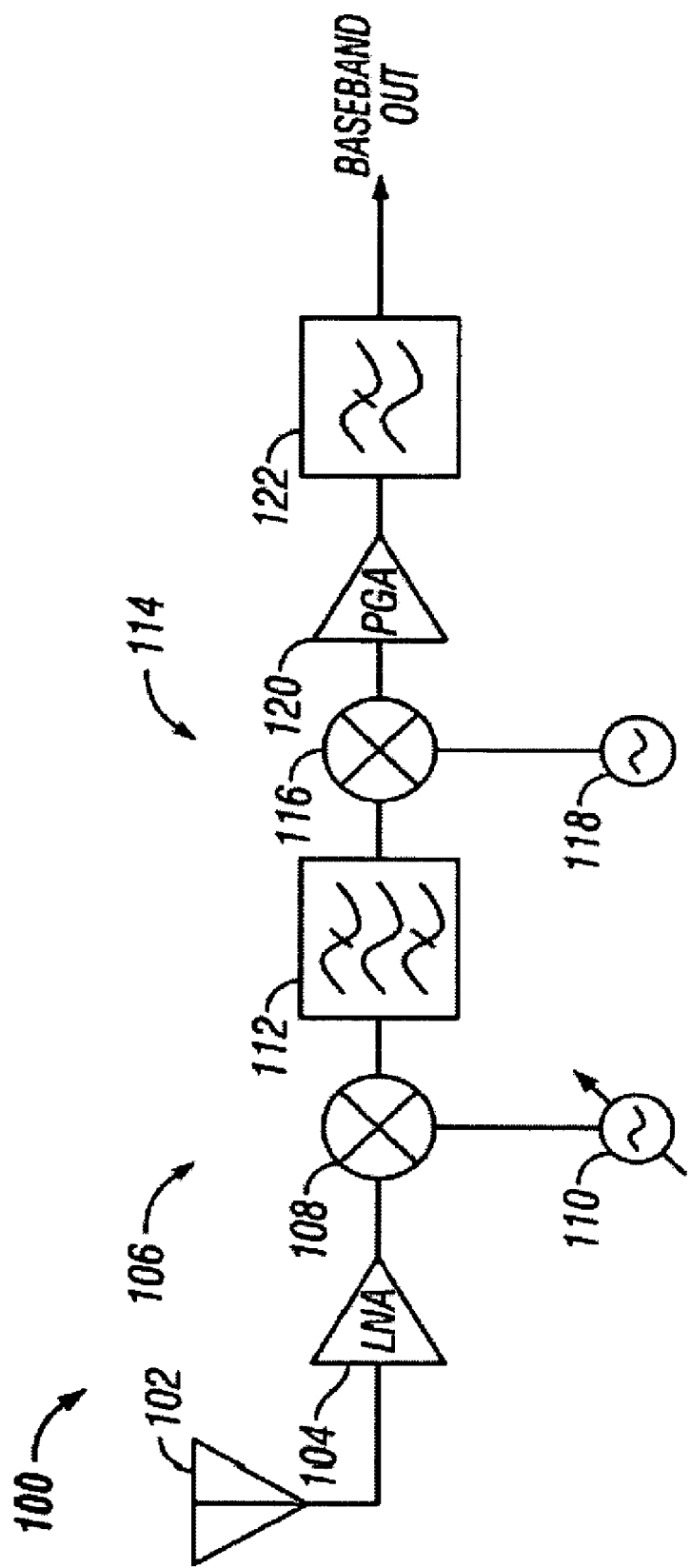
FIG. 1 illustrates in partial block diagram and partial schematic form a radio receiver according to the present invention.

FIG. 1 illustrates in partial block diagram and partial schematic form a radio receiver 100 according to the present invention. Receiver 100 is a dual-superheterodyne receiver that includes generally an antenna 102, a low noise amplifier labeled "LNA" 104, an RF to IF mixer 106, a bandpass filter 112, image rejecting mixer 114, a programmable gain amplifier labeled "PGA" 120, and a lowpass filter 122. Amplifier 104 has an input terminal connected to antenna 102, and an output terminal, and amplifies a broadband signal received on antenna 102 to provide an amplified signal to the output terminal thereof. Mixer 106 mixes the amplified signal to IF as follows. Mixer 106 includes a multiplier 108 and a tunable oscillator 110. Multiplier 108 has a first input terminal connected to the output terminal of amplifier 104, a second input terminal, and an output terminal. Tunable oscillator 110 has a tuning input terminal and an output terminal that provides an RF local oscillator (LO) signal. The RF LO signal is selected by the tuning input to have a frequency such that a desired channel is mixed from RF to a selected IF, which is also the center frequency of bandpass filter 112. Bandpass filter 112 has an input terminal connected to the output terminal of multiplier 108, and an output terminal for providing an output signal with significant signal energy in a passband centered around the chosen IF, and with significant attenuation of signal energy in a stopband outside the passband.

This signal at the output of bandpass filter 112 is then mixed to baseband in image rejecting mixer 114. Image rejecting mixer 114 includes a multiplier 116 and an oscillator 118. Multiplier 116 has a first input terminal connected to the output terminal of bandpass filter 112, a second input terminal, and an output terminal. Multiplier 114 further includes a polyphase filter for rejecting an image frequency, as will be described more fully below. Oscillator 118 provides an IF LO signal at an output terminal thereof. The IF LO signal is selected to have an output frequency chosen to mix the selected IF signal to baseband, and multiplier 116 thus provides the output signal thereof at baseband. Amplifier 120 is provided to amplify this signal to a desired level, and has an input terminal connected to the output terminal of multiplier 116, and an output terminal. Filter 122 has an input terminal connected to the output terminal of amplifier 120, and an output terminal for providing an output signal of receiver 100 labeled "BASEBAND OUT".

Receiver 100 is a dual-superheterodyne receiver with an image rejecting mixer. In order to attenuate a relatively large band of image frequencies, image rejecting mixer 114 preferably uses a polyphase filter, not shown in FIG. 1, such as the one described in copending application Ser. No. 10/814,615. The design of the oscillator 116 and multiplier 118 facilitates the image rejecting function of mixer 114 by producing differential in-phase and quadrature baseband signals with lower distortion due to improved phase clock accuracy and reduced susceptibility to gain mismatch. These features will be described more fully below but the polyphase filter will not.

Figure 2:
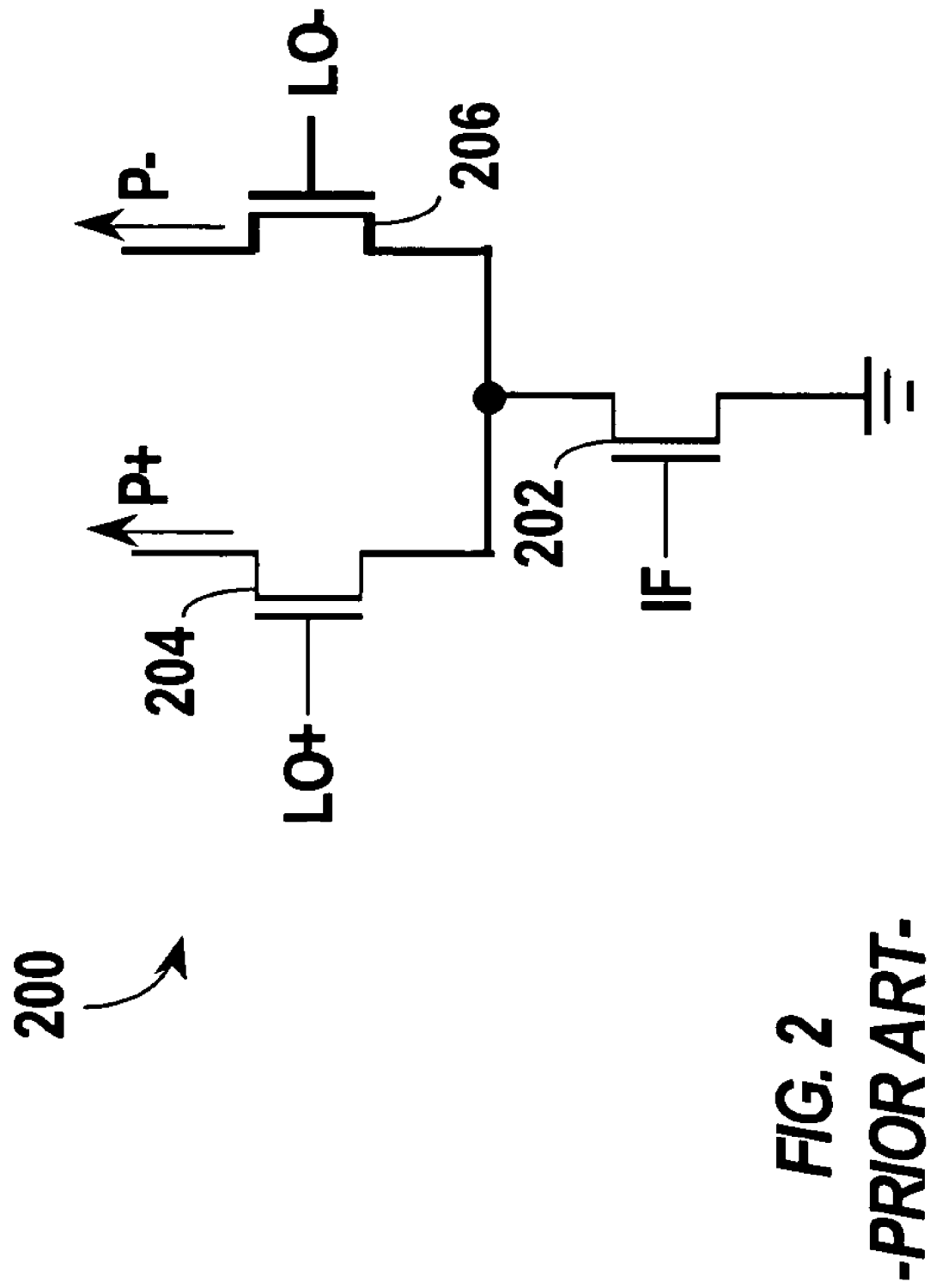
FIG. 2 illustrates in schematic form a portion of a mixer known in the prior art.

FIG. 2 illustrates in schematic form a portion 200 of a mixer known in the prior art. Mixer 200 includes three N-channel metal-oxide-semiconductor (MOS) transistors 202, 204, and 206. Note that a transistor having an insulated silicon gate is also conventionally considered to be an "MOS transistor" even though it does not have a metal gate. Transistor 202 has a drain, a gate for receiving an input signal labeled "IF", and a source connected to a ground potential, typically at zero volts. Transistor 204 has a drain for providing a positive output current signal labeled "P+", a gate for receiving a positive local oscillator signal labeled "LO+", and a source connected to the drain of transistor 202. Transistor 206 has a drain for providing a negative output current signal labeled "P−", a gate for receiving a positive local oscillator signal labeled "LO−", and a source connected to the drain of transistor 202. Portion 200 forms what is referred to as a single balanced mixer, in which the input signal (which may be an intermediate frequency signal) is mixed with a local oscillator signal to form a differential in-phase current signal. In a typical mixer this circuitry will be replicated to form a differential quadrature current signal using an LO signal in quadrature with the LO+ and LO− signal. The single-balanced mixer is susceptible to distortion caused by phase error mismatch between transistors 204 and 206, as well as between transistor 202 and the corresponding transistor in the corresponding quadrature portion of the mixer.

Figure 3:
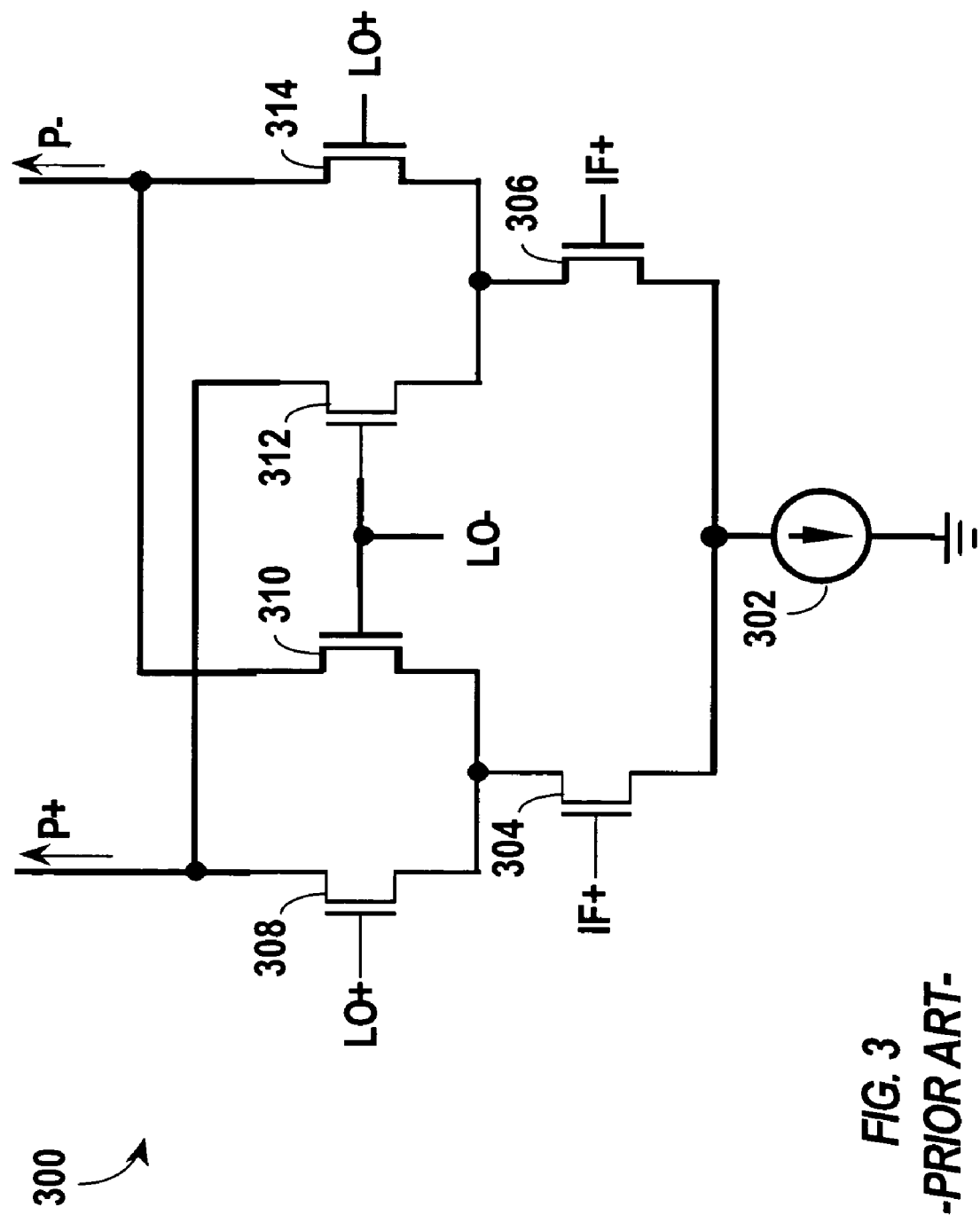
FIG. 3 illustrates in schematic form a portion of another mixer known in the prior art.

FIG. 3 illustrates in schematic form a portion 300 of another mixer known in the prior art. Portion 300 include a current source 302, and N-channel transistors 304, 306, 308, 310, 312, and 314. Current source 302 has a first terminal and a second terminal connected to ground. Transistor 304 has a drain, a gate for receiving IF+, and a source connected to the first terminal of current source 302. Transistor 306 has a drain, a gate for receiving IF−, and a source connected to the first terminal of current source 302. Transistor 308 has a drain for providing current signal P+, a gate for receiving signal LO+, and a source connected to the drain of transistor 304. Transistor 310 has a drain for providing current signal P−, a gate for receiving signal LO−, and a source connected to the drain of transistor 304. Transistor 312 has a drain connected to the drain of transistor 308, a gate for receiving signal LO−, and a source connected to the drain of transistor 306. Transistor 314 has a drain connected to the drain of transistor 310, a gate for receiving signal LO+, and a source connected to the drain of transistor 306.

Portion 300 forms what is referred to as a double balanced mixer or Gilbert cell, in which the differential input signal is mixed with a differential local oscillator signal to form a differential in-phase current signal. Like the single balanced case, this circuitry may be replicated to form a differential quadrature current signal using a quadrature local oscillator signal. Transistors 304 and 306 selectively divert the current of current source 302 based on the differential input signal. Transistors 308, 310, 312, and 314 form a "chopper" circuit that "chops" the two portions of the differential current using the differential LO signal. Since each output current signal of the differential current pair, namely P+ and P−, are formed by chopping using both LO signals, they are less susceptible to distortion from phase error between the positive and negative components of the LO clock signal. However they are still susceptible to distortion caused by phase error between the in-phase LO signal and the quadrature LO signal. They are also susceptible to mismatch between transistors 304 and 306, as well as mismatch between the current sources 302 of the in-phase and quadrature mixers.

Figure 4:
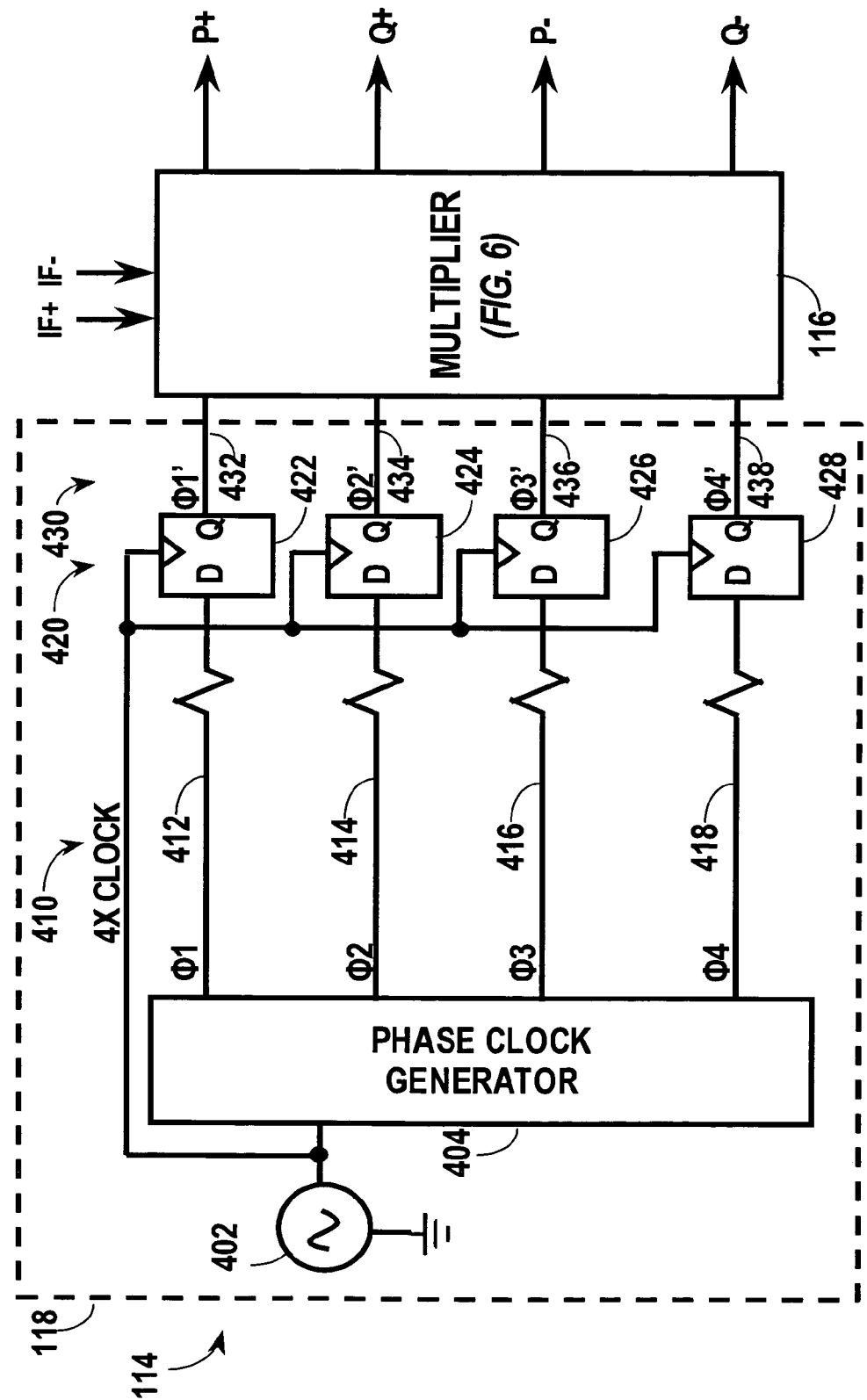
FIG. 4 illustrates in partial block diagram and partial schematic the mixer of FIG. 1.

FIG. 4 illustrates in partial block diagram and partial schematic mixer 114 of FIG. 1, including local oscillator 116 and multiplier 118. Local oscillator 116 includes generally an oscillator 402, a phase clock generator 404, a first set of conductors 410, a latch 420, and a second set of conductors 430. Oscillator 402 provides an output clock signal labeled "4X CLOCK" referenced to ground. Phase clock generator 404 has an input terminal for receiving the 4X CLOCK, and output terminals for providing four phase clock signals labeled "φ1", "φ2", "φ3", and "φ4". The phase clock signals are conducted on respective conductors 412, 414, 416, and 418, with phase clock generator 404 connected to a first end of the conductor and latch 420 connected to a second end.

Latch 420 includes D flip-flops 422, 424, 426, and 428. Flip-flop 422 has a D input terminal connected to the second end of conductor 412, a clock input terminal for receiving the 4X CLOCK, and a Q output terminal for providing a latched phase clock signal labeled "φ1'". Flip-flop 424 has a D input terminal connected to the second end of conductor 414, a clock input terminal for receiving the 4X CLOCK, and a Q output terminal for providing a latched phase clock signal labeled "φ2'". Flip-flop 426 has a D input terminal connected to the second end of conductor 416, a clock input terminal for receiving the 4X CLOCK, and a Q output terminal for providing a latched phase clock signal labeled "φ3'". Flip-flop 428 has a D input terminal connected to the second end of conductor 418, a clock input terminal for receiving the 4X CLOCK, and a Q output terminal for providing a latched phase clock signal labeled "φ4'". Conductors 430 include four conductors 432, 434, 436, and 438 each having a first end connected to the Q output terminals of latches 422, 424, 426, and 428, respectively, and a second end connected to corresponding input terminals of multiplier 118.

Multiplier 118 has four inputs connected to the second ends of conductors 432, 434, 436, and 438, a pair of signal input terminals for receiving IF+ and IF−, and four output terminals respectively providing baseband signals P+, Q+, P−, and Q−.

In order to improve phase clock accuracy, mixer 114 resynchronizes the phase clocks using the 4X CLOCK at a physical location on the integrated circuit near where the phase clocks are used, that is at multiplier 118. Latch 420 requires a relatively small amount of circuitry and it can be placed to reduce the length of conductors 430 as much as possible. The an important feature is that the impedance of conductors 430 is less than the impedance of corresponding conductors 410. Note that this characteristic will generally mean that the length of conductors 430 will be shorter than the length of conductors 410. Note however that other factors contribute to the impedance such as total conductor area, dielectric (usually silicon dioxide or silicon nitride) spacing, etc. so that length is not the only determinant of impedance.

However all other factors aside it is important to reduce the length of conductors 430 as much as possible. Thus for example each individual D flip-flop in latch 420 might be laid out as a repeated cell in close proximity to multiplier 118. The uniformity in repeating the flip-flop cell layout may cause the length of conductors 430 to be somewhat above the theoretical minimum distance but it would be desirable to reduce it as much as practical to achieve the objective of reducing distortion. Also the lengths of each one of conductors 430 need to be made as nearly equal as possible.

In sum mixer 114 improves phase clock accuracy by reducing critical signal routing length of conductors 430 (therefore reducing the opportunity for differing propagation lengths and mismatched loading), decreasing the loading at the output of latch 420, and allowing the flip flops in latch 420 to be laid out so as to match their characteristics as nearly as possible.

Figure 5:
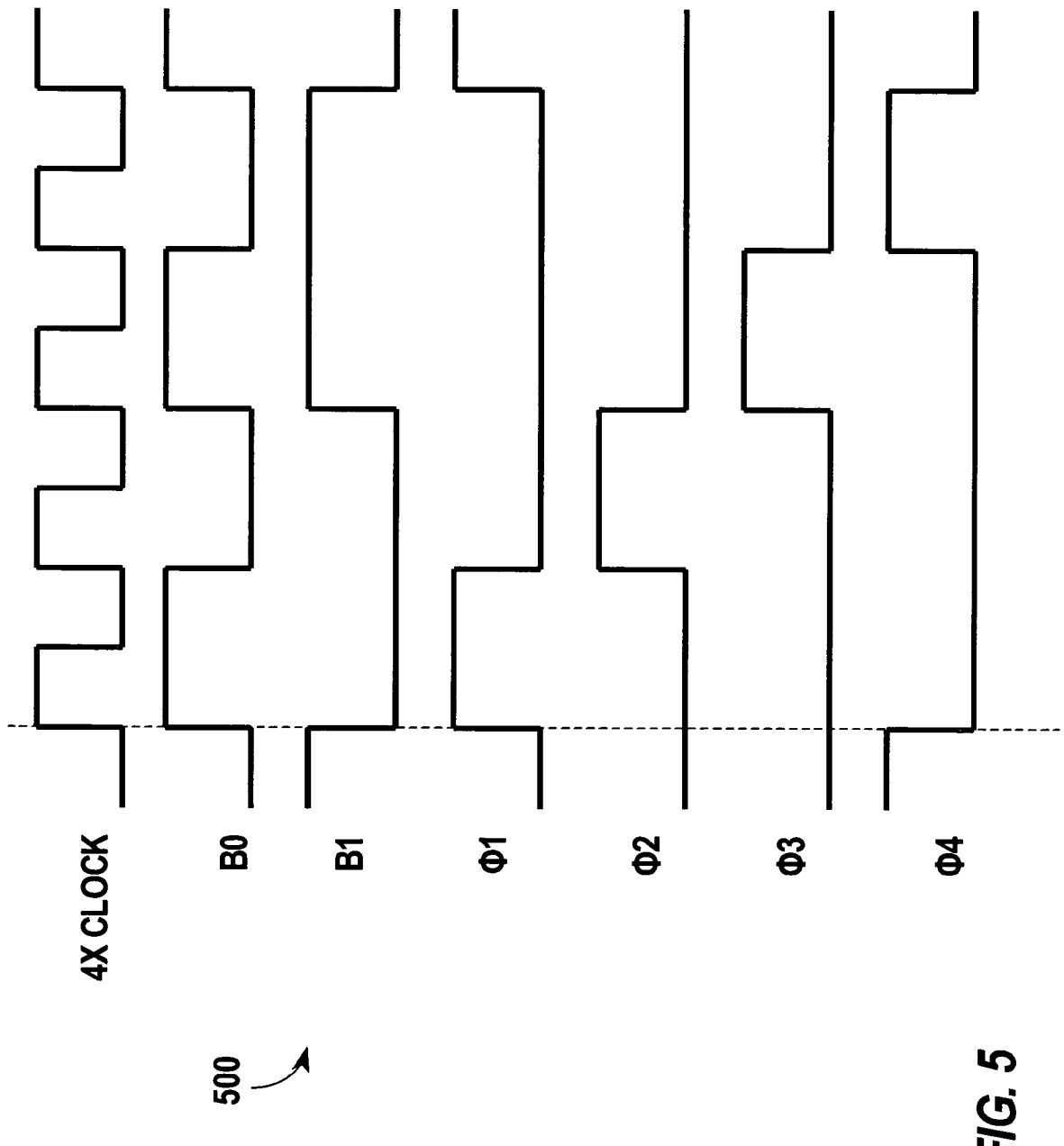
FIG. 5 illustrates a timing diagram for timing signals associated with the mixer of FIG. 4.

FIG. 5 illustrates a timing diagram 500 for timing signals associated with mixer 114 of FIG. 4. Timing diagram 500 illustrates the 4X CLOCK signal and the four phase clock signals φ1, φ2, φ3, and φ4. It also illustrates two signals labeled "B0" and "B1" that are used to generate the phase clock signals. B0 and B1 are the outputs of a binary counter (not shown in FIG. 4) that is part of phase clock generator 404 and that increments once for each cycle of the 4X CLOCK. Phase clock generator 404 generates the phase clock signals by performing logical operations on the counter outputs. Thus φ1 equals B0 and NOT B1; φ2 equals NOT B0 and NOT B1; φ3 equals B0 and B1; and φ4 equals NOT B0 and B1. Note that phase clock generator 404 may be implemented using other similar digital logic circuits.

Figure 6:
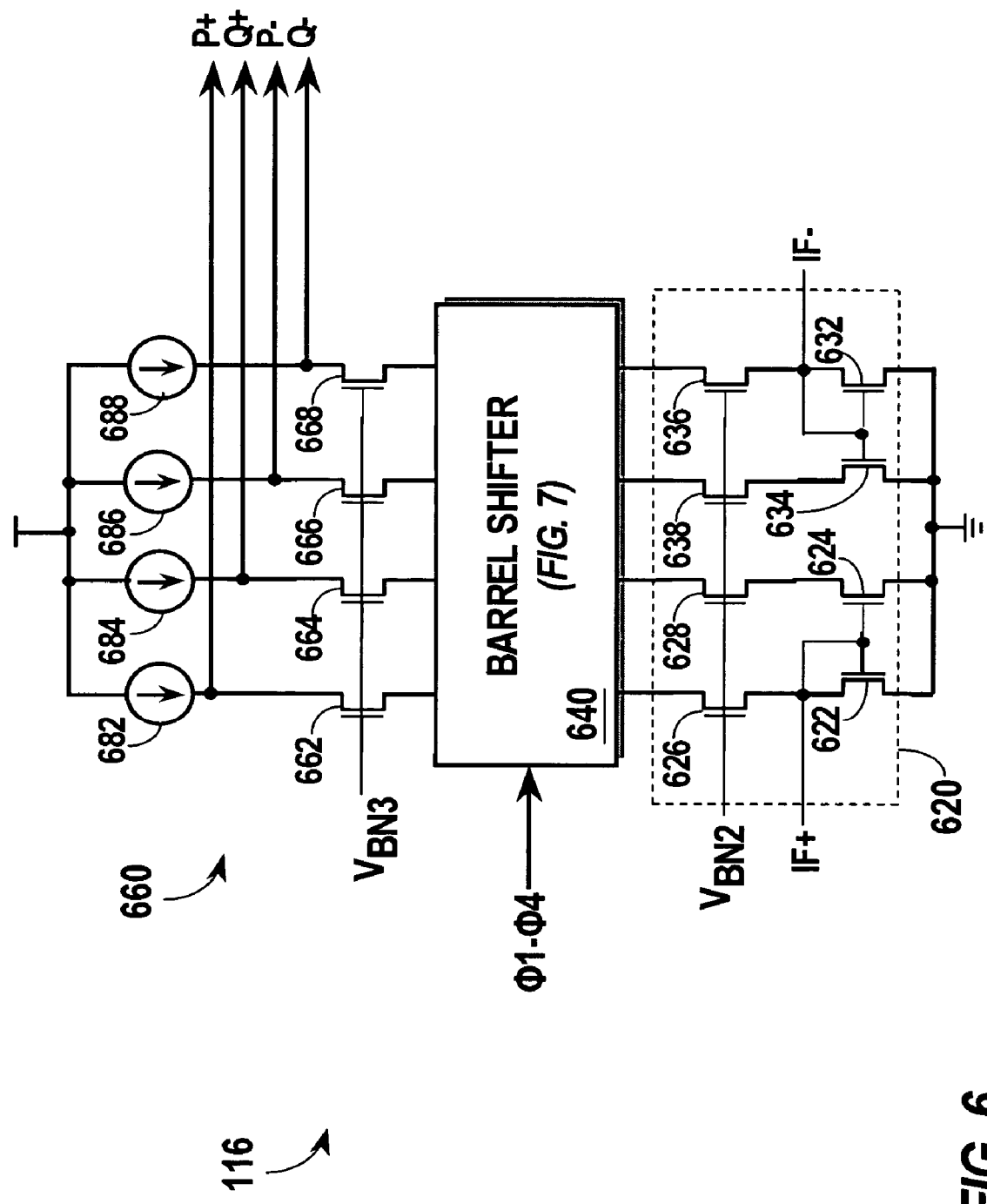
FIG. 6 illustrates in partial block diagram and partial schematic the multiplier of the mixer of FIG. 1.

FIG. 6 illustrates in partial block diagram and partial schematic multiplier 118 of mixer 114 of FIG. 1. Multiplier 118 includes generally a transconductance amplifier 620, a chopper circuit in the form of a barrel shifter 640, and a load circuit 660. Transconductance amplifier 620 includes N-channel MOS transistors 622, 624, 626, 628, 632, 634, 636, and 638. Transistor 622 has a drain and gate connected together and receiving signal IF+, and a source connected to ground. Transistor 624 has a drain, a gate connected to the drain and gate of transistor 622, and a source connected to ground. Transistor 626 has a drain for providing a negative current of a first differential input current pair, a gate for receiving a bias voltage labeled "VBN2", and a source connected to the drain of transistor 622. Transistor 628 has a drain for providing a positive current of the first differential input current pair, a gate for receiving bias voltage VBN2, and a source connected to the drain of transistor 624. Transistor 632 has a drain and gate connected together and receiving signal IF−, and a source connected to ground. Transistor 634 has a drain, a gate connected to the drain and gate of transistor 632, and a source connected to ground. Transistor 636 has a drain for providing a positive current of a second differential input current pair, a gate for receiving bias voltage VBN2, and a source connected to the drain of transistor 632. Transistor 638 has a drain for providing a negative current of the second differential input current pair, a gate for receiving bias voltage VBN2, and a source connected to the drain of transistor 634.

Barrel shifter 620 has four input terminals respectively receiving the positive and negative currents of the first and second differential input current pairs, four clock input terminals for receiving clock signals φ1–φ4, and four output terminals connected to respective nodes for providing positive and negative currents of each of the first and second differential output current pairs.

Load circuit 660 includes four N-channel MOS transistors 662, 664, 666, and 668, and four current sources 682, 684, 686, and 688. Transistor 662 has a drain for providing an output voltage labeled "P+", a gate for receiving a bias voltage labeled "VNB3", and a source connected to the first node for receiving the negative current of the first differential output current pair. Transistor 664 has a drain for providing an output voltage labeled "Q+", a gate for receiving bias voltage VNB3, and a source connected to the second node for receiving the positive current of the first differential output current pair. Transistor 666 has a drain for providing an output voltage labeled "P−", a gate for receiving bias voltage VNB3, and a source connected to the third node for receiving the positive current of the second differential output current pair. Transistor 668 has a drain for providing an output voltage labeled "Q−", a gate for receiving bias voltage VNB3, and a source connected to the fourth node for receiving the negative current of the second differential output current pair. Current source 682 has a first terminal connected to a positive power supply voltage terminal, and a second terminal connected to the drain of transistor 662. Current source 684 has a first terminal connected to the positive power supply voltage terminal, and a second terminal connected to the drain of transistor 664. Current source 686 has a first terminal connected to the positive power supply voltage terminal, and a second terminal connected to the drain of transistor 666. Current source 688 has a first terminal connected to the positive power supply voltage terminal, and a second terminal connected to the drain of transistor 668.

In operation, transconductance amplifier 620 provides a linear input impedance and a linear differential output current. The linear input impedance is formed using two stacked pairs of N-channel MOS transistors, 622/626 and 632/636, operating in saturation and strong inversion. Transistors 622 and 632 are diode connected and cascode transistors 626 and 636 are biased with a constant bias voltage VBN2. Each of two additional pairs of transistors 624/628 and 634/638 forms a current mirror with their respective diode-connected transistors. The differential currents formed thereby are linear with respect to the input voltage. The linear input impedance helps the receiver IC operate with an impedance-sensitive external SAW filter.

More specifically, it can be demonstrated that the differential output current is linear with respect to the input voltage and the impedance is fixed and can be controlled to match the desired output impedance of the SAW filter. If $I_{D622}$ represents the drain current of transistor 622, then its value is given by the expression:

$$I_{D622} = \beta_{622}(V_{IF+} - V_T)^2 \qquad [1]$$

where VIF+ is the voltage of signal IF+, $V_T$ is the threshold of transistor 622, and $\beta_{622}$ is a constant based on the physical and process characteristics of transistor 622. Likewise if $I_{D626}$ represents the drain current of transistor 626, then its value is given by the expression:

$$I_{D626} = \beta_{626}[(V_{BN2} - V_{IF+}) - V_T]^2 \qquad [2]$$

Now if VBN2 and $V_{IN}$ are defined to be set as follows:

$$V_{BN2} = 2V_T + 2V_{ON} \qquad [3]$$

and $$V_{IF+} = V_T + V_{ON} + V_I \qquad [4]$$

where $V_{ON}$ is a constant and $V_I$ is the input signal relative to $(V_T + V_{ON})$, then $$I_{D622} = \beta_{622}(V_{ON} + V_I)^2 \qquad [5]$$

and $$I_{D626} = \beta_{626}(V_{ON} - V_I)^2 \qquad [6]$$

We know that transistors 622 and 626 are matched in size, so we can define $\beta = \beta_{622} = \beta_{626}$. If the input current $I_{IN}$ is defined as the current output from the SAW filter, then $$\begin{aligned} I_{IN} &= I_{D622} - I_{D626} \\ &= \beta(V_{ON}^2 + 2V_I V_{ON} + V_I^2) - \beta(V_{ON}^2 - 2V_I V_{ON} + V_I^2) \\ &= 4\beta V_I V_{ON} \end{aligned} \qquad [7]$$

which is linear with respect to input voltage. The input impedance $Z_{IN}$ is given by:

$$Z_{IN} = \frac{V_I}{I_{IN}} = \frac{1}{4\beta V_{ON}} \qquad [8]$$

which is constant and controllable. The first differential input current $I_{DIFF1}$ is given by $$I_{OUT} = I_{D628} - I_{D626} = I_{D626} - I_{D622} = -4\beta V_I V_{ON} \qquad [9]$$

since $I_{D628}=I_{D624}=I_{D622}$. It should be clear that the second differential input current $I_{DIFF2}$ is derived similarly and the other portion of transconductance amplifier 620 receiving signal IF− will have the same properties of constant input impedance and linear differential output current. Note that transistors 622, 624, 626 and 628 will all have the same sizes in order to generate symmetrical differential input currents. Likewise transistors 632, 634, 636, and 638 will all have the same sizes.

The linear differential output current allows the use of a special chopper circuit (barrel shifter 640) that has further advantageous properties. Barrel shifter 640 compensates for phase clock error by switching currents forming both in-phase and quadrature output signals using the same set of clock signals, substantially canceling the effect of this phase clock error.

Figure 7:
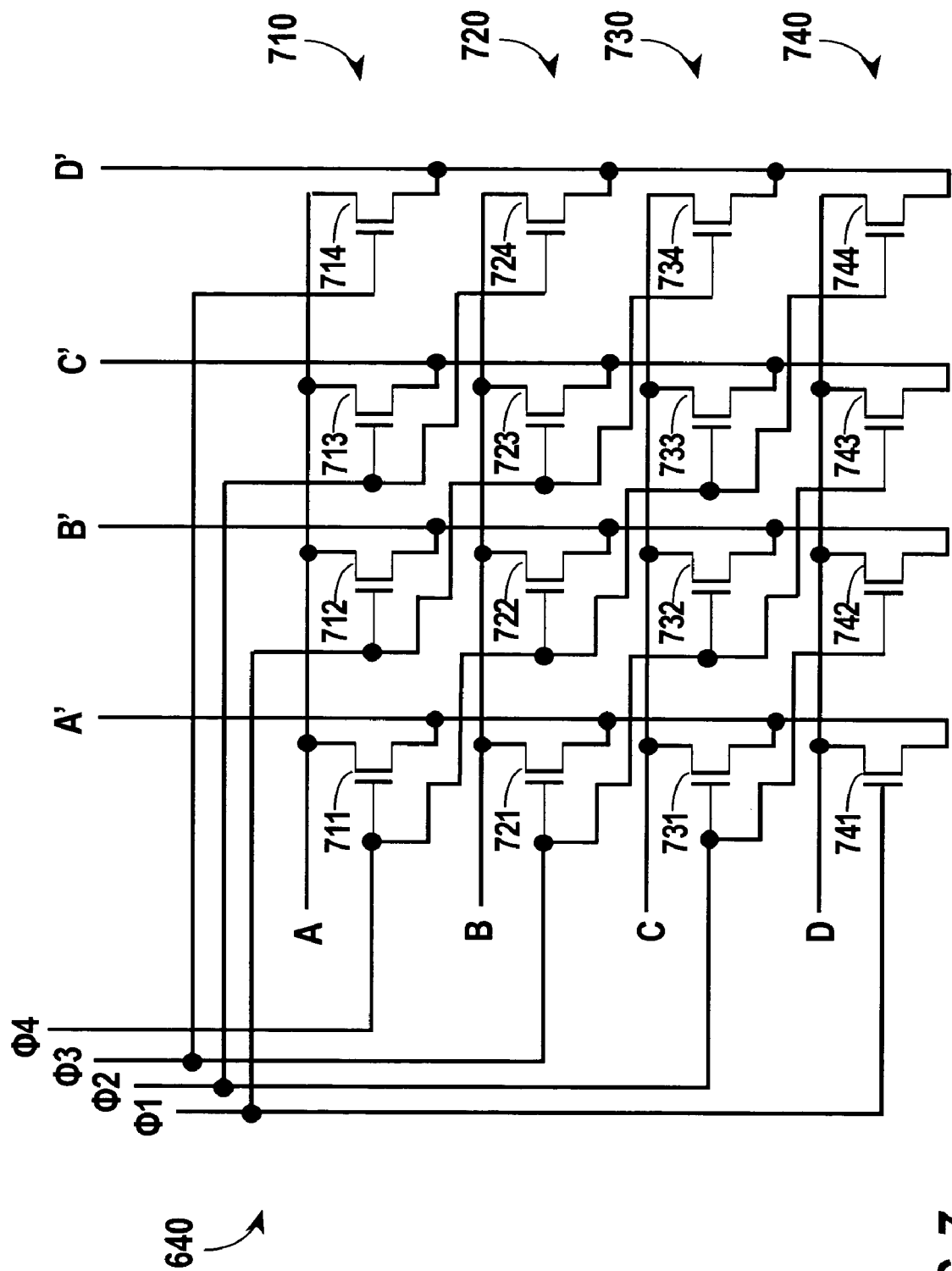
FIG. 7 illustrates in schematic form the barrel shifter of FIG. 6.

The operation of the barrel shifter is better understood with reference to FIG. 7, which illustrates in schematic form barrel shifter 640 of FIG. 6. Barrel shifter 640 includes four input nodes labeled "A", "B", "C", and "D" for receiving positive and negative input currents of first and second differential input current pairs, and four output nodes labeled "A'", "B'", "C'" and "D'" into which barrel shifter 640 provides positive and negative output currents of first and second differential output current pairs. Barrel shifter 640 includes generally four rows of transistors 710, 720, 730, and 740. Row 710 includes N-channel MOS transistors 711, 712, 713, and 714 each having a source connected to the A input node, gates for receiving respective ones of signals φ4, φ1, φ2, and φ3, and drains connected to respective ones of output nodes A', B', C', and D'. Row 720 includes N-channel MOS transistors 721, 722, 723, and 724 each having a source connected to the B input node, gates for receiving respective ones of signals φ3, φ4, φ1, and φ2, and drains connected to respective ones of output nodes A', B', C', and D'. Row 730 includes N-channel MOS transistors 731, 732, 733, and 734 each having a source connected to the C input node, gates for receiving respective ones of signals φ2, φ3, φ4, and φ1, and drains connected to respective ones of output nodes A', B', C', and D'. Row 740 includes N-channel MOS transistors 741, 742, 743, and 744 each having a source connected to the D input node, gates for receiving respective ones of signals φ1, φ2, φ3, and φ4, and drains connected to respective ones of output nodes A', B', C', and D'.

Barrel shifter 640 improves mixer gain matching over known chopper circuits by rotating the transistors used to chop each input current. Thus if one transistor caused gain mismatch relative to other transistors, it would be used to chop the input current only one-fourth of the time. Barrel shifter 640 also drives each output current using all four phase clock signals. Since such a phase clock error will distort both the positive and negative components of the differential in-phase or quadrature current pair in the same way, the effect will tend to be cancelled.

Returning now to FIG. 6, load circuit 660 converts the differential output current pairs at the output of barrel shifter 640 into corresponding differential voltage pairs. Cascode transistors 662, 664, 666, and 668 are biased by constant bias voltage VBN3 and reduce the voltage swing on cascode transistors 626, 628, 636, and 638, thereby improving linearity. Furthermore they also reduce the coupling of switching noise to the outputs.

Note that one of ordinary skill in the art will readily be able to construct an analogous P-channel MOS transconductance stage according to the principles described above. Also the various components of mixer 114 can be used together or in various combinations with known mixer circuits. Furthermore various polyphase filter designs are suitable for use in mixer 114. Mixer 114 uses the polyphase filter to pass the upper sideband and attenuate the lower sideband of the desired signal. However mixer 114 may be altered to pass the lower sideband and attenuate the upper sideband by simply reversing the sequence of clocks φ1–φ4, for example by swapping clocks φ1 and φ3 (or φ2 and φ4). Known mixers require that one of the LO clocks (in-phase or quadrature) be inverted to change the selected sideband.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A transconductance amplifier comprising:
   a first transistor having a first current electrode for receiving an input voltage, a control electrode coupled to said first current electrode, and a second current electrode coupled to a power supply voltage terminal;
   a second transistor having a first current electrode, a control electrode coupled to said first current electrode of said first transistor, and a second current electrode coupled to said power supply voltage terminal;
   a third transistor having a first current electrode for providing a negative current of a differential current pair, a control electrode for receiving a bias voltage, and a second current electrode coupled to said first current electrode of said first transistor; and
   a fourth transistor having a first current electrode for providing a positive current of said differential current pair, a control electrode for receiving said bias voltage, and a second current electrode coupled to said first current electrode of said second transistor,
   wherein said first, second, third and fourth transistors are characterized as operating in saturation and strong inversion.

2. The transconductance amplifier of claim 1 wherein said first, second, third, and fourth transistors comprise metal oxide semiconductor (MOS) transistors.

3. The transconductance amplifier of claim 2 wherein said first, second, third, and fourth transistors further comprise N-channel MOS transistors.

4. The transconductance amplifier of claim 2 wherein said first and second transistors have equal sizes, and said third and fourth transistors have equal sizes.

5. A transconductance amplifier comprising:
   a first transistor having a first current electrode for receiving a positive voltage of a differential input voltage pair, a control electrode coupled to said first current electrode, and a second current electrode coupled to a first power supply voltage terminal;
   a second transistor having a first current electrode, a control electrode coupled to said first current electrode of said first transistor, and a second current electrode coupled to said first power supply voltage terminal;
   a third transistor having a first current electrode for providing a negative-positive current of a first differential current pair, a control electrode for receiving a bias voltage, and a second current electrode coupled to said first current electrode of said first transistor;

a fourth transistor having a first current electrode for providing a negative current of said first differential current pair, a control electrode for receiving said bias voltage, and a second current electrode coupled to said first current electrode of said second transistor;

a fifth transistor having a first current electrode for receiving a negative voltage of said differential input voltage pair, a control electrode coupled to said first current electrode, and a second current electrode coupled to said power supply voltage terminal;

a sixth transistor having a first current electrode, a control electrode coupled to said first current electrode of said fifth transistor, and a second current electrode coupled to said power supply voltage terminal;

a seventh transistor having a first current electrode for providing a positive current of a second differential current pair, a control electrode for receiving said bias voltage, and a second current electrode coupled to said first current electrode of said fifth transistor; and an eighth transistor having a first current electrode for providing a negative current of said second differential current pair, a control electrode for receiving said bias voltage, and a second current electrode coupled to said first current electrode of said sixth transistor.

6. The transconductance amplifier of claim 5 wherein said first, second, third, fourth, fifth, sixth, seventh, and eighth transistors comprise metal oxide semiconductor (MOS) transistors.

7. The transconductance amplifier of claim 6 wherein said first, second, third, fourth, fifth, sixth, seventh, and eight transistors further comprise N-channel MOS transistors.

8. The transconductance amplifier of claim 5 wherein said first, second, third, fourth, fifth, sixth, seventh, and eighth transistors are characterized as operating in a saturation and strong inversion.

9. The transconductance amplifier of claim 5 wherein said first, second, fifth, and sixth transistors are characterized as having equal sizes, and said third, fourth, seventh, and eight transistors are characterized as having equal sizes.

10. A mixer comprising:
a transconductance amplifier for generating a first input differential current pair in response to an input voltage; and
a chopper circuit for receiving said first input differential current pair and a first mixing signal and having an output for providing positive and negative currents of a first output differential current pair to first and second nodes, respectively, in response thereto,
wherein said transconductance amplifier comprises:
a first transistor having a first current electrode for receiving said input voltage, a control electrode coupled to said first current electrode, and a second current electrode coupled to a first power supply voltage terminal;
a second transistor having a first current electrode, a control electrode coupled to said first current electrode of said first transistor, and a second current electrode coupled to said first power supply voltage terminal;
a third transistor having a first current electrode for providing a negative current of said first input differential current pair, a control electrode for receiving a bias voltage, and a second current electrode coupled to said first current electrode of said first transistor; and
a fourth transistor having a first current electrode for providing a positive current of said first input differential current pair, a control electrode for receiving said bias voltage, and a second current electrode coupled to said first current electrode of said second transistor.

11. The mixer of claim 10 further comprising:
a load coupled to said first and second nodes for converting said positive and negative currents of said first output differential current pair to positive and negative output voltages, respectively.

12. The mixer of claim 11 wherein said load comprises:
a first cascade transistor having a first current electrode, a control electrode for receiving a second bias voltage, and a second current electrode for providing a negative voltage of a first differential output voltage pair;
a first current source having a first terminal coupled to a second power supply voltage terminal, and a second terminal coupled to said first current electrode of said first cascade transistor;
a second cascade transistor having a first current electrode, a control electrode for receiving said second bias voltage, and a second current electrode for providing a positive voltage of said first differential output voltage pair; and
a second current source having a first terminal coupled to said second power supply voltage terminal, and a second terminal coupled to said first current electrode of said second cascode transistor.

13. The mixer of claim 10, wherein said first, second, Third and fourth transistors are characterized as operating in saturation and strong inversion.

14. The mixer of claim 13 wherein said first; second, third, and fourth transistors comprise metal oxide semiconductor (MOS) transistors.

15. The mixer of claim 10 wherein said first, second, third, and fourth transistors further comprise N-channel MOS transistors.

16. The mixer of claim 10 wherein said first and second transistors are characterized as having equal sizes, and said third and fourth transistors are characterized as having equal sizes.

17. The mixer of claim 10 wherein said transconductance amplifier further receives a complement of said input voltage and provides a second differential input current in response thereto.

18. The mixer of claim 17 wherein said chopper circuit further receives said second differential input current and a second mixing signal and provides positive and negative currents of a second differential output current pair to third and fourth nodes, respectively, in response thereto.

19. The mixer of claim 18 wherein said first and second mixing signals comprise an in-phase local oscillator signal and a quadrature local oscillator signal, respectively.

20. The mixer of claim 17 wherein said transconductance amplifier further comprises:
a fifth transistor having a first current electrode for receiving a complement of said input voltage, a control electrode coupled to said first current electrode, and a second current electrode coupled to said first power supply voltage terminal;
a sixth transistor having a first current electrode, a control electrode coupled to said first current electrode of said fifth transistor, and a second current electrode coupled to said second power supply voltage terminal;
a seventh transistor having a first current electrode for providing a positive current of said second differential input current pair, a control electrode for receiving said bias voltage, and a second current electrode coupled to said first current electrode of said fifth transistor; and an eighth transistor having a first current electrode for providing a negative current of said second differential input current pair, a control electrode for receiving said bias voltage, and a second current electrode coupled to said first current electrode of said sixth transistor.

21. The mixer of claim 20 wherein said first, second, fifth, and sixth transistors are characterized as having equal sizes, and said third, fourth, seventh, and eighth transistors are characterized as having equal sizes.

22. The mixer of claim 17 wherein said mixer converts a signal formed by said input voltage and said complement of said input voltage to another frequency.

* * * * *